(12) United States Patent
Shannon et al.

(10) Patent No.: US 7,994,872 B2
(45) Date of Patent: Aug. 9, 2011

(54) APPARATUS FOR MULTIPLE FREQUENCY POWER APPLICATION

(75) Inventors: Steven C. Shannon, Raleigh, NC (US);
Jang Gyoo Yang, San Jose, CA (US);
Matthew L. Miller, Fremont, CA (US);
Kartik Ramaswamy, San Jose, CA
(US); James P. Cruse, Santa Cruz, CA
(US)

(73) Assignee: Applied Materials, Inc., Santa Clara, CA (US)

( * ) Notice: Subject to any disclaimer, the term of this patent is extended or adjusted under 35 U.S.C. 154(b) by 192 days.

(21) Appl. No.: 12/506,658

(22) Filed: Jul. 21, 2009

(65) Prior Publication Data
US 2010/0013572 A1    Jan. 21, 2010

Related U.S. Application Data

(60) Provisional application No. 61/082,441, filed on Jul. 21, 2008.

(51) Int. Cl.
*H03H 7/40* (2006.01)
(52) U.S. Cl. ...................... 333/17.3; 333/32; 333/99 PL
(58) Field of Classification Search .................... 333/32, 333/17.3, 99 PL, 124
See application file for complete search history.

(56) References Cited

U.S. PATENT DOCUMENTS

| | | | | |
|---|---|---|---|---|
| 5,936,481 A | * | 8/1999 | Fujii | ............................ 333/17.3 |
| 6,259,334 B1 | * | 7/2001 | Howald | ....................... 333/17.3 |
| 2003/0054647 A1 | | 3/2003 | Suemasa et al. | |
| 2005/0133163 A1 | | 6/2005 | Shannon et al. | |

FOREIGN PATENT DOCUMENTS

| | | |
|---|---|---|
| JP | 2005142150 A | 6/2005 |
| JP | 2006345001 A | 12/2006 |

OTHER PUBLICATIONS

PCT Search Report and Written Opinion dated Mar. 22, 2010 (PCT/US2009/051240).

* cited by examiner

*Primary Examiner* — Stephen E Jones
(74) *Attorney, Agent, or Firm* — Patterson & Sheridan, L.L.P.

(57) ABSTRACT

Apparatus and methods are provided for a power matching apparatus for use with a processing chamber. In one aspect of the invention, a power matching apparatus is provided including a first RF power input coupled to a first adjustable capacitor, a second RF power input coupled to a second adjustable capacitor, a power junction coupled to the first adjustable capacitor and the second adjustable capacitor, a receiver circuit coupled to the power junction, a high voltage filter coupled to the power junction and the high voltage filter has a high voltage output, a voltage/current detector coupled to the power junction and a RF power output connected to the voltage/current detector.

12 Claims, 5 Drawing Sheets

APPARATUS FOR MULTIPLE FREQUENCY POWER APPLICATION

CROSS-REFERENCE TO RELATED APPLICATIONS

This application claims benefit of U.S. Provisional Patent Application Ser. No. 61/082,441, filed Jul. 21, 2008, which is incorporated herein by reference in the entirety.

BACKGROUND OF THE INVENTION

Field of the Invention

Embodiments of the present invention generally relate to an apparatus and method for impedance matching. More particularly, embodiments of the present invention relate to an apparatus and method for matching impedance in radio frequency (RF) circuits with multiple nominal carrier frequencies.

The continuing growth in wireless communications has spurred the demand for utilizing more radio frequency (RF) signals in various products. When employing an RF circuit, it is important to match the impedance of the RF load to the impedance of the RF antenna feed cable, especially when the antenna is fed by an unbalanced transmission cable, such as a coaxial cable. Coaxial cables are normally designed to provide a 50Ω normative resistance to the antenna. However, the input impedance of the antenna will be changed by the antenna attachment mechanism. It is often found that the input impedance of the antenna is non-matching when measured from the coaxial cable feed point.

The input impedance of an antenna can be expressed by $Z=R+jX$, wherein R and X are respectively the real and imaginary parts of the input impedance. In order to attain favorable radiating efficiency, the loss produced by the imaginary part X need to be eliminated. However, complex calculations for impedance matching are often required, and the accuracy may be sacrificed. Hence, an improved impedance matching means for RF circuits is required.

SUMMARY OF THE INVENTION

Apparatus and methods are provided for a power matching apparatus, such as an impedance matching circuit. The impedance matching circuit may have one or more adjustable operating parameters and incorporate techniques for adjusting the operating parameters. In one aspect of the invention, a power matching apparatus is provided including a first RF power input coupled to a first adjustable capacitor, a second RF power input coupled to a second adjustable capacitor, a power junction coupled to the first adjustable capacitor and the second adjustable capacitor, a receiver circuit coupled to the power junction, a high voltage filter coupled to the power junction and the high voltage filter has a high voltage output, a voltage/current detector coupled to the power junction and a RF power output connected to the voltage/current detector.

BRIEF DESCRIPTION OF THE DRAWINGS

So that the manner in which the above recited features of the present disclosure can be understood in detail, a more particular description, briefly summarized above, may be had by reference to embodiments, some of which are illustrated in the appended drawings. It is to be noted, however, that the appended drawings illustrate only certain typical embodiments of this disclosure and are therefore not to be considered limiting of its scope, for the description may admit to other equally effective embodiments.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The power matching apparatus, such as the impedance matching circuit described herein, may be used in a variety of different applications. As a specific, but not limiting example of a suitable application, the impedance matching circuit may be used in semiconductor processing equipment, such as that shown in FIG. 1 and described below.

Figure 1:
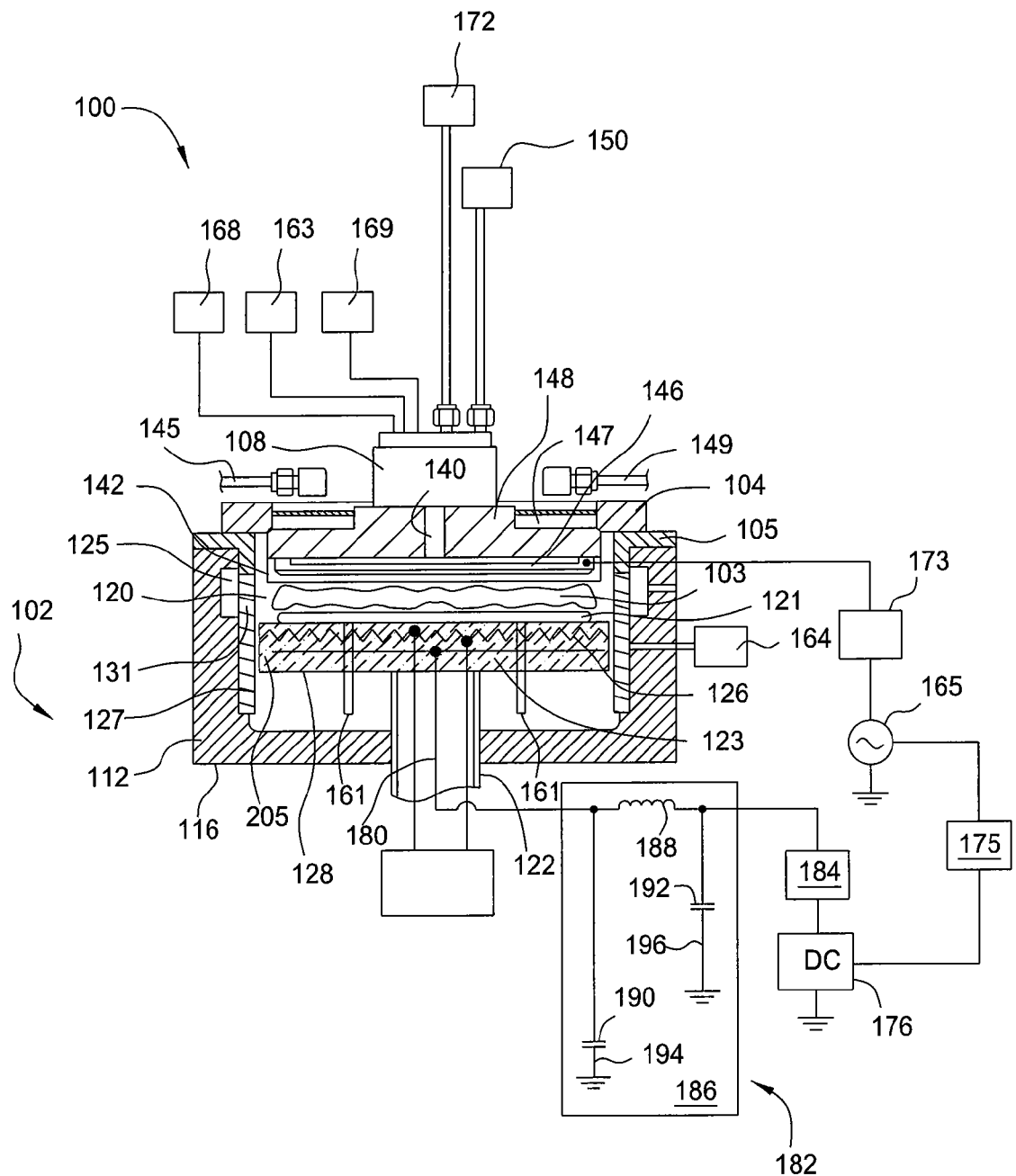
FIG. 1 shows a schematic cross-sectional view of a plasma processing chamber in accordance with one embodiment of the present disclosure.

FIG. 1 is a schematic cross-sectional view of one embodiment of a plasma enhanced chemical vapor deposition (PECVD) system 100. The PECVD system 100 generally comprises a chamber body 102 supporting a chamber lid 104 which may be attached to the chamber body 102 by one or more fasteners, such as screws, bolts, hinges, and the like. The chamber body 102 comprises chamber sidewall 112 and a bottom wall 116 defining a processing volume 120 for containing a plasma 103 between a substrate support 128 and a showerhead assembly 142. A controller 175 is coupled to the system 100 to provide process control, such as gas delivery and exhaust, transfer functions, among other functions.

The chamber lid 104 is coupled to a gas distribution system 108 for delivering reactant and cleaning gases into the processing volume 120 via the shower head assembly 142. The shower head assembly 142 includes a gas inlet passage 140 which delivers gas into the processing volume 120 from one or more gas inlets 168, 163, and 169. A remote plasma source (not shown) may be coupled between the processing volume 120 and the gas inlets 168, 163, and 169. The PECVD system 100 may also include a liquid delivery source 150 and a gas source 172 configured to provide a carrier gas and/or a precursor gas. A circumferential pumping channel 125 formed in the sidewall 112 and coupled to a pumping system 164 is configured for exhausting gases from the processing volume 120 and controlling the pressure within the processing volume 120. A chamber liner 127, preferably made of ceramic or the like, may be disposed in the processing volume 120 to protect the sidewall 112 from the corrosive processing environment. A plurality of exhaust ports 131 may be formed on the chamber liner 127 to couple the processing volume 120 to the pumping channel 125.

A base plate 148 integrates the chamber lid 104, gas distribution system 108 and shower head assembly 142. A cooling channel 147 is formed in the base plate 148 to cool the base plate 148 during operation. A cooling inlet 145 delivers a coolant fluid, such as water or the like, into the cooling channel 147. The coolant fluid exits the cooling channel 147 through a coolant outlet 149.

The substrate support 128 is configured for supporting and holding a substrate 121 during processing. The substrate support 128 is adapted to move vertically within the processing volume 120, and may additionally be configured to rotate by a drive system coupled to a stem 122. Lift pins 161 may be included in the substrate support 128 to facilitate transfer of substrates into and out of the processing volume 120. In one embodiment, the substrate support 128 includes at least one electrode 123 to which a voltage is applied to electrostatically secure the substrate 121 thereon. The electrode 123 is powered by a direct current (DC) power source 176 connected to the electrode 123. Although the substrate support 128 is depicted as a monopolar DC chuck, embodiments described herein may be used on any substrate support adapted to function as a ground plane in a plasma chamber and may additionally be a bipolar chuck, a tripolar chuck, a DC chuck, an interdigitated chuck, a zoned chuck, and the like.

The substrate support 128 may comprise heating elements 126, for example resistive heating elements, to heat the substrate 121 positioned thereon to a desired process temperature. The heating elements 126 may be coupled to an alternating current (AC) power supply (not shown) configured to provide a voltage, such as about 208 volts to the heating elements 126.

A radio frequency (RF) power source 165 is coupled to the showerhead assembly 142 through an impedance matching circuit 173. The faceplate 146 of the showerhead assembly 142 and the electrode 123, which may be grounded via an electronic filter, such as a capacitor 190, form a capacitive plasma generator. The RF source 165 provides RF energy to the showerhead assembly 142 to facilitate generation of a capacitive plasma between the faceplate 146 of the showerhead assembly 142 and the substrate support 128. Thus, the electrode 123 provides both a ground path for the RF source 165 and an electrical bias from DC power source 176 to enable electrostatic clamping of the substrate 121.

The substrate support 128 generally comprises a body made of a ceramic material, such as aluminum oxide ($Al_2O_3$), aluminum nitride (AlN), silicon dioxide ($SiO_2$), or other ceramic materials. In one embodiment, the body of the substrate support 128 is configured for use at a temperature in the range of about −20° C. to about 700° C. The electrode 123 may be a mesh, such as an RF mesh, or a perforated sheet of material made of molybdenum (Mo), tungsten (W), or other material with a substantially similar coefficient of expansion to that of the ceramic material comprising the body of the substrate support 128. The electrode 123 embedded in substrate support 128, together with faceplate 146 of showerhead assembly 142, cooperatively define processing volume 120.

The RF source 165 may comprise a high frequency radio frequency (HFRF) power source, for example one or more of a 13.56 MHz RF generator, a 60 MHz RF generator, a 126 MHz RF generator, and a low frequency radio frequency (LFRF) power source, for example a 2 MHz RF generator. The LFRF power source provides both low frequency generation and fixed match elements. The HFRF power source is designed for use with a fixed match and regulates the power delivered to the load, eliminating concerns about forward and reflected power.

The electrode 123 is coupled to a conductive member 180. The conductive member 180 may be a rod, a tube, wires, or the like, and be made of a conductive material, such as molybdenum (Mo), tungsten (W), or other material with a substantially similar coefficient of expansion with other materials comprising the substrate support 128. The electrode 123 functions as a return path for RF power and a biasing electrode to enable electrostatic chucking of the substrate. In order to provide an electrical bias to the substrate 121, the electrode 123 is in communication with a power supply system 182 that supplies a biasing voltage to the electrode 123. The power supply system 182 includes DC power source 176 to supply a DC signal to the electrode 123 and an electronic filter 186 adapted to filter voltage fluctuations between DC power source 176 and electrode 123. In one embodiment, DC power source 176 is a 24 volt DC power supply and the electrical signal may provide a positive or negative bias.

DC power source 176 may be coupled to an amplifier 184 to amplify the electrical signal from DC power source 176. Voltage fluctuations are filtered by electronic filter 186 to prevent DC power source 176 and amplifier 184 from suffering voltage spikes. In one embodiment, filter 186 may be an inductor 188 with capacitors 190 and 192 in parallel. The amplified and filtered electrical signal is provided to the electrode 123 and the substrate 121 to enable electrostatic clamping of the substrate 121. Capacitors 190 and 192 also allow electrode 123 to function as a ground member for RF power, wherein RF power is coupled to ground by connectors 194 and 196. Capacitors 190 and 192 prevent DC power from DC power source 176 from going to ground, while passing RF power. In one embodiment, the capacitors 190 and 192 may each be 0.054 micro Farad ($\mu F$) capacitors at 10-15 amps and about 2000 volts. In this manner, the electrode 123 functions as a substrate biasing electrode and a return electrode for RF power.

As described above, the electrode 123 provides a bias from DC power source 176 and functions as a ground path for RF energy from RF power source 165. The capacitively coupled plasma 103 generated in the processing volume 120 may be tuned by the matching circuit 173 based on signals from the controller 175. However, the configuration of the electrode 123, in its function as a ground plane for RF energy, may not provide an acceptable plasma discharge or spatial distribution. For example, the periphery of the substrate 121 may encounter only intermittent plasma discharge, which results in incomplete or reduced deposition at the periphery. In another embodiment, the periphery of the plasma 103 may produce a region 15 along the periphery of the substrate, which may be an area where excessive deposition and buildup of deposited material occurs on the substrate 121.

In the embodiment illustrated by FIG. 1, the electrode 123 may be shaped to counteract plasma edge effects. Angling the periphery of the electrode 123, as shown in this embodiment, results in generation of an electric field having radial as well as axial components inside the processing volume 120. The potential difference between the electrode 123 and the face plate 146 is different at different points on the electrode 123. These potential differences result in electrostatic forces that push charged particles from the face plate 146 to the electrode 123, the axial component of the electric field, and closer to or further from the center of the chamber, the radial component of the electric field. Additionally, the electrode 123 may be tuned by adjusting DC power to the electrode based on signals from the controller 175. In this way, the ground plane for the plasma generator, exemplified in this embodiment by the electrode 123, is tunable and allows for mitigation of plasma edge effects.

Figure 2:
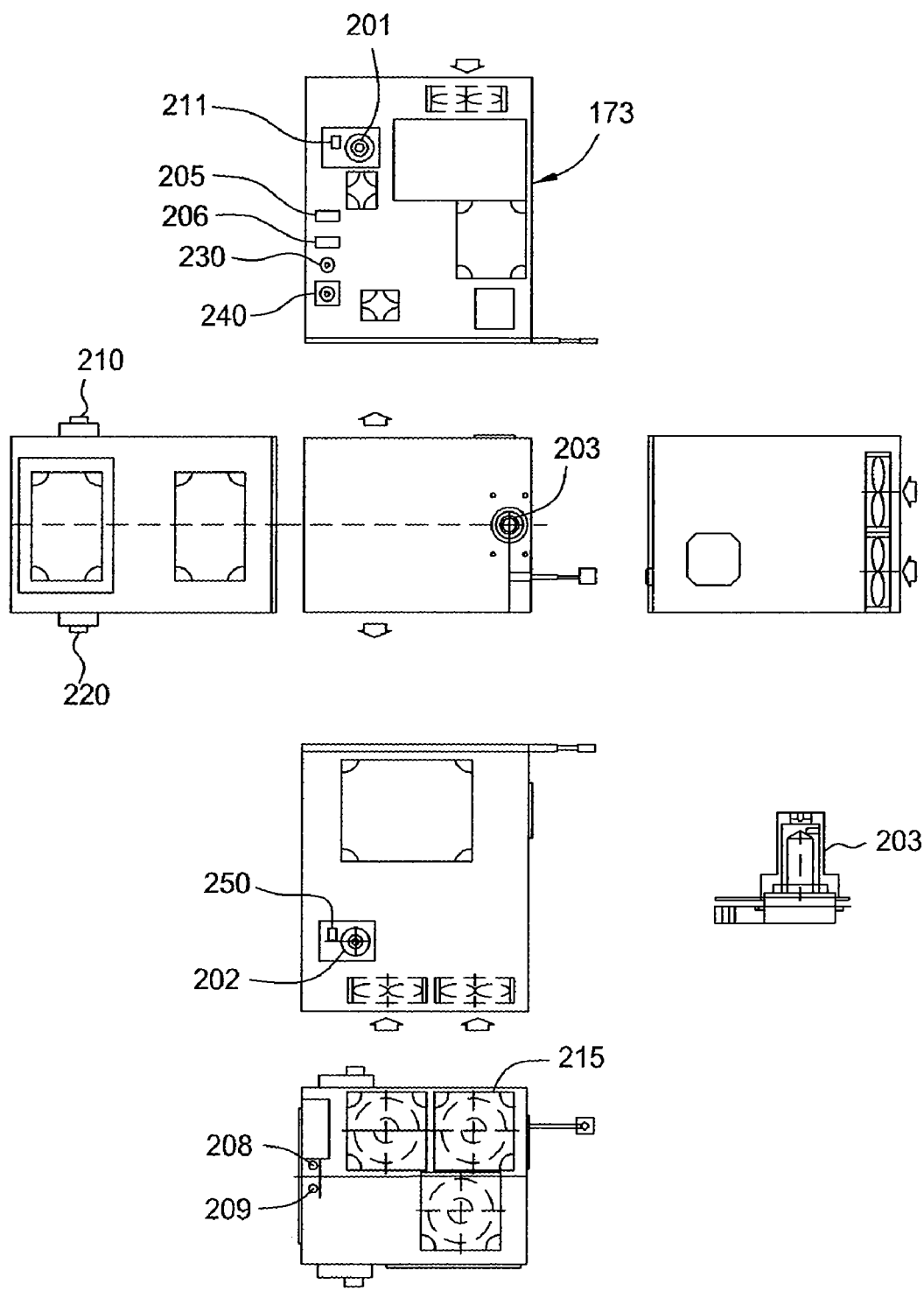
FIG. 2 shows the impedance matching circuit in accordance with one embodiment of the present disclosure.
Figure 3:
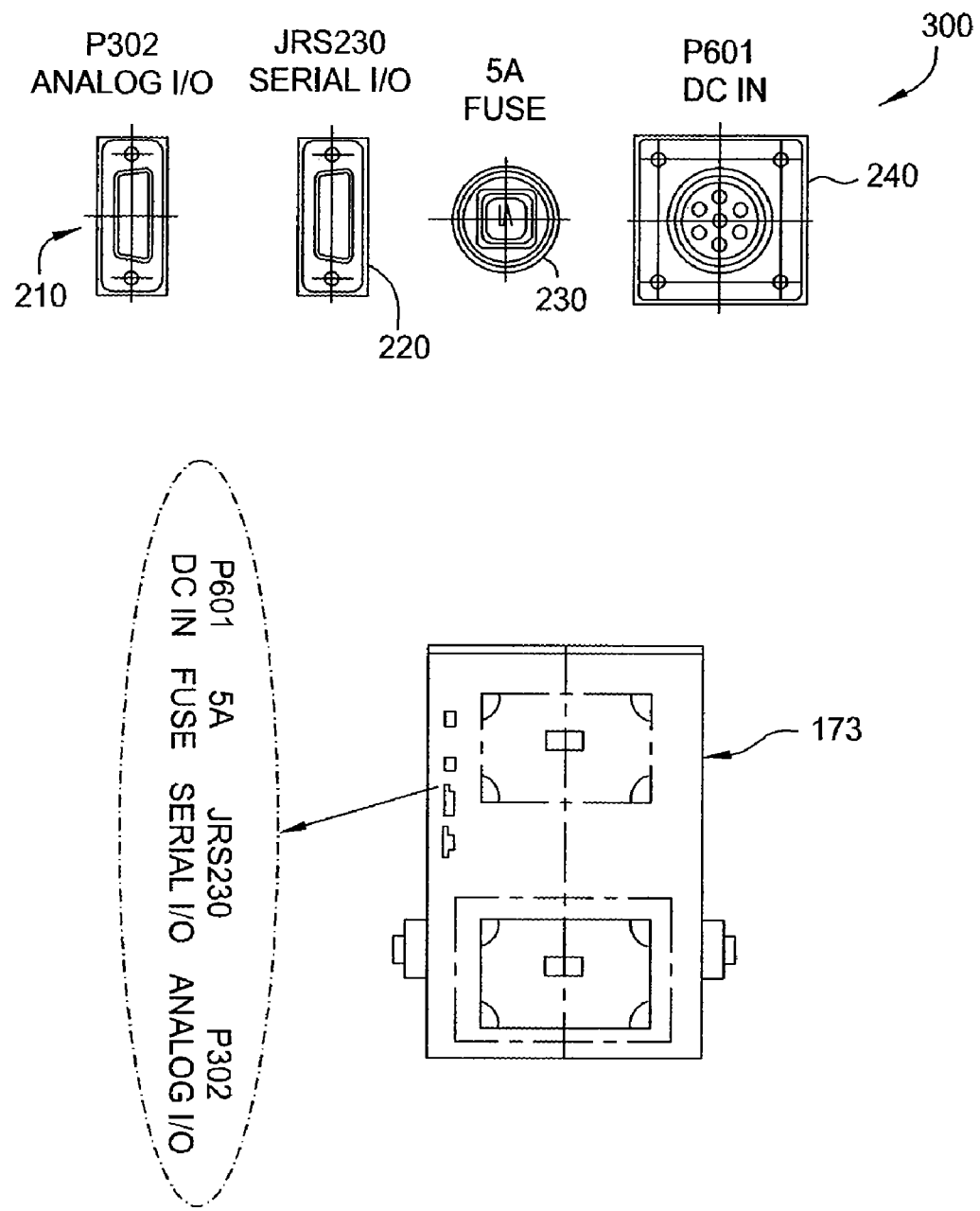
FIG. 3 shows the details of the labeling from FIG. 2 in accordance with one embodiment of the present disclosure.

The RF matching circuit (also referred to as a matching network or tuner) 173 from FIG. 1 is illustrated in greater detail in FIG. 2 and FIG. 3. The RF matching circuit may be disposed in a match box of dimensions including a width of 240 mm (millimeters) to 290 mm, such as about 265 mm (about 10.5 inches), a length of 375 mm (millimeters) to 425 mm, such as about 400 mm (about 15.75 inches), and a height of 315 mm (millimeters) to 365 mm, such as about 340 mm (about 13.4 inches)

The RF matching (matching impedance) circuit may transform the complex impedance of the process chamber into the 50Ω preferred by the RF generator. The RF matching circuit is mounted to the cathode underneath the chamber and connected to the RF power generator via a coaxial RF cable. This match circuit may support multiple frequency, such as dual frequency bands, between 1.8 MHz and 2.17 MHz (hereafter defined as 2 MHz nominal frequency) and between 12.88 MHz and 14.23 MHz (hereafter defined as 13.56 MHz nominal frequency). The power may be from 1 W up to 5 kW at 13.56 MHz nominal frequency and may be from 1 W up to 7.5 kW at 2 MHz nominal frequency.

The RF matching circuit may be of a suitable size to locate or mount at or near the processing equipment with which it is being utilized. In one particular embodiment, the RF matching circuit is 10.4 inches wide, 13.4 inches high and 15.8 inches deep. These dimensions do not include fans, mounting plate, or RF power input. The maximum weight is 55 Lbs. (or 25 Kg.). The mechanical mounting may be composed of the bare metal as also illustrated in FIG. 2.

For certain embodiments, the impedance matching circuit may have a plurality of connectors to facilitate interfacing with the device. As examples, there are several connectors illustrated in FIG. 2. The RF power input connector 202 may be a QRM(m) connector for 2 MHz nominal frequency, and the RF power input connector 201 may be a QRM(f) connector for 13.56 MHz nominal frequency. The 2 MHz RF input interlock 250 is illustrated in FIG. 2. Additional connectors in FIG. 2 include an analog I/O connector 205, a serial I/O connector 206, a power indicator 208, an interlock indicator 209, cooling fans 215, and the 13.56 MHz RF input interlock 250. The RF power output connector 203 is of multi-contact B 20N type, and may be adapted for HV and RF power outputs. The serial connector 220 is the female 9-pin D subminiature connector. The analog interface 210 is the male 9-pin D subminiature connector. The DC Power Input Connector 240 is the receptacle male 7-pin CPC connector. The details of these connectors are also provided in FIG. 3.

The back of the mounting plate may be conductive and flat. The matching circuit 173 may make a contact with a 60 mm diameter RF gasket on the mounting plate around the RF connector. The cover may be designed to discourage tampering by untrained personnel. The cooling may be performed by ambient air. Materials for the apparatus may be compatible with a clean room environment (non particle generating).

Figure 4:
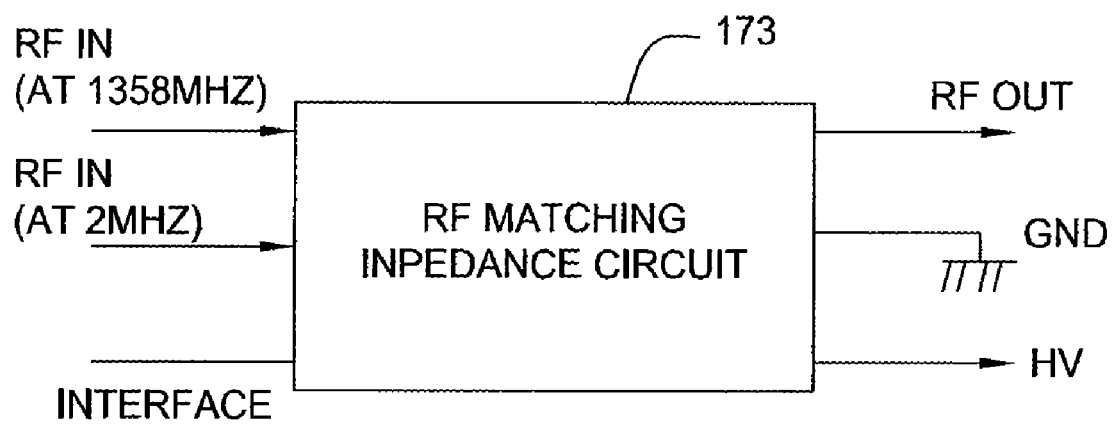
FIG. 4 shows the logic block diagram of the impedance matching circuit in accordance with one embodiment of the present disclosure.
Figure 5:
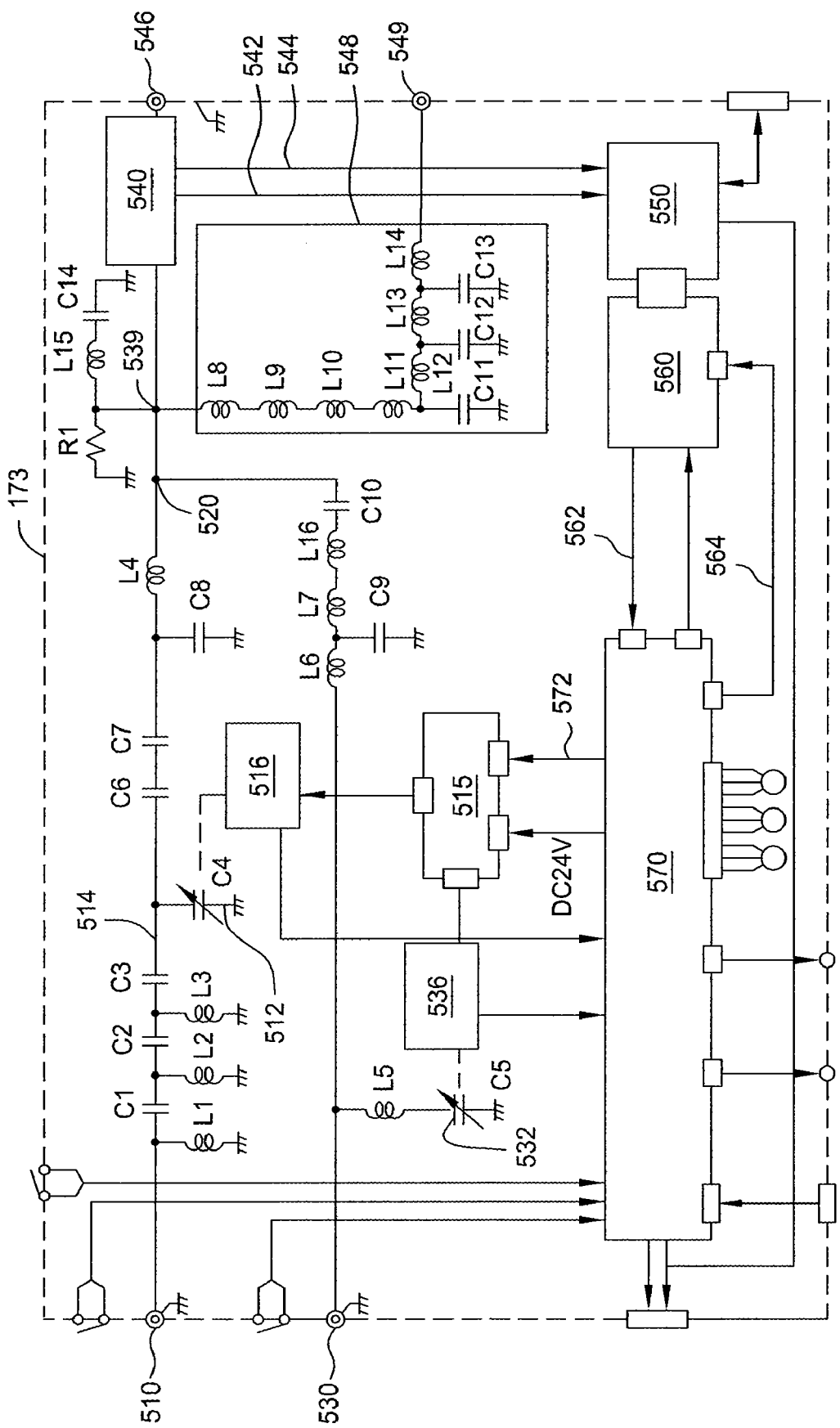
FIG. 5 shows the schematic of the impedance matching circuit in accordance with one embodiment of the present disclosure.

The logic block diagram of the RF impedance matching circuit 173 is given in FIG. 4, and the detailed schematic is shown in FIG. 5. The complex RF input impedance is converted into the desired RF real matching impedance of 50Ω at the output. The RF power output may have a resistive path (of 100 MΩ, for example) to the ground inside the matching circuit 173 to discharge residual charges. The high voltage output from the HV module may be connected to the RF power output of the matching circuit. The HV module is used to provide a high voltage DC output to a substrate support in a coupled processing chamber to electro-statically clamp a substrate. The matching circuit prevents resonances or other interaction between itself and the HV module that could affect HV module performance. The HV filter within the HV filter module 548 prevent the RF power from entering the high voltage module and provides a DC voltage output at 549.

Example electrical specifications of the RF matching circuit are also provided in this disclosure. The input voltage may be 24 V±5%, the standby current may be 3.0 A (amperes), the continuous current may be 8.0 A (amperes), and the peak current may be 10.0 A (amperes).

For certain embodiments, the impedance matching circuit may be able to operate in different frequency ranges. For example, the operating frequency may be a multiple frequency, such as a dual: 13.56 MHz nominal or 2 MHz nominal. The voltage rating may be from 1 up to 2800 $V_{rms}$ working voltage maximum at 13.56 MHz nominal frequency, or from 1 up to 2800 $V_{rms}$ working voltage maximum at 2 MHz nominal frequency. The voltage rating may be from 1 up to 2800 $V_{rms}$ working voltage maximum at 162 MHz and/or 60 MHz nominal frequency. The current rating may be from 1 up to 75 $A_{rms}$ maximum at 13.56 MHz nominal frequency, or may be from up to 20 $A_{rms}$ maximum at 2 MHz nominal frequency. The current rating may be from 1 up to 75 $A_{rms}$ maximum at 162 MHz and/or 60 MHz nominal frequency. The reference test may be the high power test into dummy load with known impedance.

For certain embodiments, the input RF power of 5 kW may be applied at 13.56 MHz nominal frequency and of 7.5 kW at 2 MHz nominal frequency. The maximum power limit may be dependent on the operating impedance. The reflected power may be up to 10 W or 2% of forward power from 55 W to 5000 W for 13.56 MHz nominal frequency, up to 10 W or 2% of forward power from 75 W to 7500 W for 2 MHz nominal frequency, whichever is greater, at the tool, when shunt capacitor positions are optimized for load. Optimal frequency tuning of associated RF generator may be assumed.

The nominal impedance and tuning time may be of any suitable value depending on a particular application. For example, for certain embodiments, the nominal impedance may be 50Ω, and the tuning time may be less than 3 seconds.

The matching network is also illustrated in FIG. 5. The minimum tuning range for the nominal frequency of 13.56 MHz may be: 5.0–j·3.0 ohms (frequency of 12.88 MHz, capacitor C4 in FIG. 5), 5.5–j·20.0 ohms (frequency of 14.24 MHz, capacitor C4 in FIG. 5), 0.8–j·6.0 ohms (frequency of 12.88 MHz, capacitor C4 in FIG. 5), 0.8–j·23.0 ohms (frequency of 14.24 MHz, capacitor C4 in FIG. 5). The minimum tuning range for the nominal frequency of 2 MHz may be: 75.0–j·35.0 ohms (frequency of 1.8 MHz, capacitor C5 in FIG. 5), 160.0–j·100.0 ohms (frequency of 2.18 MHz, capacitor C5 in FIG. 5), 19.0–j·40.0 ohms (frequency of 1.8 MHz, capacitor C5 in FIG. 5), 19.0–j·210.0 ohms (frequency of 2.18 MHz, capacitor C5 in FIG. 5).

The matching network 173 as illustrated in FIG. 5, includes a first RF input 510 for a first power signal at a first frequency, such as the 13.56 MHZ nominal frequency, and from a first RF power generation source. The first RF input 510 is electrically coupled to a first tunable, or adjustable, capacitor 512 (capacitor C4) having an adjustable capacitance via line 514. The tunable capacitor is a motor driven capacitor controlled by and coupled to a motor driver board 515 via motor sensor 516. Line 514 includes an alternating series of grounded inductors and capacitors to further tune the matching to the 50 ohms characteristic impedance, while reducing signal noise in the first power signal from the first RF input 510. The tunable capacitor 512 matches the impedance of the first signal with a second power signal. The adjustable capacitor 512 is electronically coupled to a power junction 520 via line 518 where the first and second power signals merge.

The matching network 173 includes a second RF input 530 for a second power signal at a second frequency less than the first frequency, such as the 2 MHz frequency, from a second RF power generation source. The second RF input 530 is electrically coupled to a second tunable, or adjustable, capacitor 532 (capacitor C5) having an adjustable capacitance via line 534. The adjustable capacitor is a motor driven capacitor controlled by and coupled to a motor driver board 515 via motor sensor 536. The adjustable capacitor 532 modifies the second power signal to reduce the impedance for matching with a second power signal. The adjustable capacitor 532 is electronically coupled to a power junction 520 via line 538 where the first and second power signals merge.

Alternatively, the matching network 173 may include a third RF input for a third power signal at a third frequency greater than the first and/or second frequencies, such as a 162 MHz frequency (nominal), from a third RF power generation source adapted to produce from 1 W to 10 kW. The third frequency from the source current may be 162 MHz, 60 MHz, or both. If both 162 MHz and 60 MHz are used, a fourth adjustable capacitor may also be used in the circuit. The third RF input is electrically coupled to a third tunable, or adjustable, capacitor having an adjustable capacitance. The tunable capacitor may be a motor driven capacitor controlled by and coupled to a motor driver board via motor sensor. The third adjustable capacitor modifies the third power signal to reduce the impedance for matching with the first and second power signal. The third adjustable capacitor may be electronically coupled via a line to the power junction 520 where the first and second power, and optionally third power, signals merge.

The power junction 520 is coupled to a voltage/current (V/I) detector 540, which detector 540 is adapted to receive the first and second power signals. The detector 540 forwards a separate voltage signal 542 and a separate current signal 544 to an analog board 550. The combined RF power signal for the two different frequencies leave the turning network at RF power output 546 to a processing chamber.

The combined RF power signal from the first and second power signal is electrically coupled to a high voltage (HV) filter board 548 at junction 539 composed of a series of inductors and capacitors and the high voltage signal leaves the filter network at HV output 549 to the processing chamber. The HV module in the match is a filter network.

The voltage signal 542 and the separate current signal 544 received by the analog board are converted in a digital signal for use with the digital board 560. The analog board 550 converts a digital voltage RF signal, i.e., (indication of wafer bias, to an analog signal for a DC power supply). The digital board 560 may be used for setting up communication with a system controller (not shown). The interface board 570 may handle communication within the matching circuit 173.

Optionally, the inductor L15 and capacitor C14 may constitute a receiver circuit adjusted for reception of a signal with a third frequency (or fourth frequency), such as a source frequency of 162 MHz, 60 MHz, or both. The addition of a third frequency signal may maximize the source power to the voltage output applied to the substrate support the bias. The receiver circuit is coupled to the power junction 539.

The current and voltage are calculated and compared to a target voltage and current. A control signal 562 is sent to an interface board 570 to provide instructions to the interface board for modification of the circuit components to provide the targeted voltage and current. A data signal 564 is sent from the interface board 570 to the digital board indicating the new setting of the circuit components. The interface board 570 controls the values of the various capacitors, such as 512 and 532. The control signal is a digital signal to the interface board 570 commanding the capacitor to adjust the capacitor value to a specific value, such as movement of one of the plates comprising a capacitor. Based on the adjusted value (position error) signal from the sensor, the interface board generates a signal indicating to the digital board indicating if the capacitor value is adjusted properly (if the capacitor was moved correctly).

The interface board 570 forwards a signal 572 to the motor driven board for positioning the adjustable capacitors 512 and 532. The respective motor sensors 516 and 536 send respective signals to the interface board indicating the position of the capacitors.

Additionally, referring to FIG. 5, C1, C2, C3, C6, C7, C10, are capacitors. C8, C9, C11, C12, C13, and C14 are grounded capacitors. L1, L2, L3 are grounded inductors. L4, L5, L6, L7, L8, L9, L10, L11, L12, L13, L14, L15, and L16 are inductors. R1 is a resistor.

It is believed that the dual (or more) power match of two (or more) different frequencies provide for the RF generators to have the frequencies and impedances as generated and the chamber output is not detrimentally affected by a power impedance mismatch. The combined HV and RF power output is believed to enable a greater efficiency in the matching apparatus and chamber configurations.

For certain embodiments, there may be no oscillation of a capacitor position for any stable load. The high frequency response may be more than 15 dB attenuated from the output to the input at 60 MHz, while the impedance may be measured at the end of calibration unit at 162 MHz within range of $0\Omega<R<1\Omega$ (resistance) and $-0.5\Omega<X<0.5\Omega$ (resistance).

The voltage/current detector may have a peak input voltage up to 5000 V at 2.0 MHz nominal frequency, and between 0 and 5000 V at 13.56 MHz nominal frequency. The accuracy may be ±5 V or ±15.0%, whichever is greater. The nominal frequency of 2 MHz may be tested at impedance of (50−j100) $\Omega$, and nominal frequency of 13 MHz to be tested at (1−j10) $\Omega$. The unit to unit repeatability may be ±5 V or ±15.0% whichever is greater. Repeatability may be determined by using Quality Assurance Checklist history of manufactured components.

The range of input current to the voltage/current detector may be between 0 and 20 $A_{rms}$ at 2.0 MHz nominal frequency and between 0 and 75 $A_{rms}$ at 13.56 MHz nominal frequency. The accuracy of input current may be ±0.2 A or ±15.0% whichever is greater. The nominal frequency of 2 MHz may be tested at impedance of (50−j100)$\Omega$, and nominal frequency of 13 MHz may be tested at impedance of (1−j10)$\Omega$. Unit to unit repeatability may be ±5 V or ±15.0% whichever is greater. Also, unit to unit repeatability of DC voltage output ($V_{DC}$) may be ±5 V or ±15.0% whichever is greater.

An additional sensor may be incorporated in the filter network that reads the source current of 162 MHz in the case of ENABLER™ chamber, of 60 MHz for EMAX™ chamber, and of 60 MHz and 162 MHz in an e7 chamber. Also, a closed loop control may be provided that activates the tuning element (162 MHz shunt capacitor as an example) based on a reading from the sensor. A tuning element may be an adjustable capacitor that operates at 162 MHz.

The impedance matching circuit is designed to provide voltage and current at the output. The following equations are used by the matching circuit to calculate the target values of the voltage and current from the matching circuit:

$$V_{target5,x,y,z} = \sqrt{\frac{P_{del5,x,y,z}(R_{3,x,y}^2 + X_{3,x,y}^2)}{R_{3,x,y} + ESR_{4,x}}}, \quad (1)$$

-continued $$I_{target_{5 \cdot x \cdot y \cdot z}} = \sqrt{\frac{P_{del_{5 \cdot x \cdot y \cdot z}}}{R_{3 \cdot x \cdot y} + ESR_{4 \cdot x}}}, \quad (2)$$

where $P_{del}$ is the delivered specified power, R is the actual real resistance measured, X is the actual imaginary resistance measured, and ESR is the equivalent series resistance measured.

In one embodiment of the present disclosure, configuration of the interface is specified. The serial port is 9 pin D subminiature, female. Rate of the communication set-up of the serial port may be 9600 baud units, the character length may be 8 bits, the ODD parity may be used, one stop bit may be defined, and the communication mode may be asynchronous. One or more of the pins may be open. A second pin may be transmitting pin, a third pin may be receiving pin, and another pin may be common serial interface.

The analog port is 9 pin D subminiature, male. One or more of the pins may be open. One pin may be common analog pin (common for pin 9). Two other pins may be interlock pins. Another pin may be common analog pin (common for pin 9). A further pin is the DC output pin. DC output voltage at this pin may be between 0 V and −10 V, and the output resistance is 100 kΩ.

The DC output may be computed as:

$$V_{dc} = -\frac{AV_{13}BI_{13} + CV_2 + DI_2 - E\sqrt{(CV_2 + DI_2)(AV_{13} + BI_{13})}}{400}, \quad (3)$$

where parameters A, B, C, D, and E may be provided via serial communication from the CCM per protocol. The calculation of voltages for $V_{target}$, and/or $V_{DC}$ out is believe to enable the matching circuit to transforms the complex impedance of the process chamber to the 50Ω required by the RF generators. The matching circuit is believed to separate the RF generator power from the chamber power and to separate the RF generator powers from each other in view of the complex impedance of the process chamber to the 50Ω required by the RF generators so that the desired power from the RF generators and the chamber are matched without undue interference from the others.

The power connector may be composed of seven pins. The first and sixth pins may be DC power supplies of 24 V. The second and seventh pins may be 24 V supplies. The third and fifth pins may not be connected, and the fourth pin may be the chassis ground.

Filtering and shielding may be incorporated to prevent high frequencies from being transmitted to the RF generator or high voltage module, and to prevent interference with match tuning or with output signals.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A power matching apparatus, comprising:
   a first RF power input coupled to a first adjustable capacitor;
   a second RF power input coupled to a second adjustable capacitor;
   a power junction coupled to the first adjustable capacitor and the second adjustable capacitor;
   a receiver circuit coupled to the power junction;
   a high voltage filter coupled to the power junction and the high voltage filter has a high voltage output;
   a voltage/current detector coupled to the power junction; and
   an RF power output connected to the voltage/current detector.

2. The power matching apparatus of claim 1, wherein the RF power output further comprises the high voltage output from a high voltage filter board coupled to the power junction.

3. The power matching apparatus of claim 1, wherein the first RF power input is coupled to a first RF generator providing a first power signal at a first frequency and the second RF power input is coupled to a second RF generator providing a second power signal at a second frequency less than the first frequency.

4. The power matching apparatus of claim 3, wherein the first RF power input is coupled to a first RF generator providing a first power signal at a first frequency between 12.88 MHz and 14.23 MHz at a RF power level of up to 5 KW and the second RF power input is coupled to a second RF generator providing a second power signal at a second frequency between 1.8 MHz and 2.17 MHz at a RF power level of up to 7.5 kW.

5. The power matching apparatus of claim 4, wherein the receiver circuit is adapted to receive a signal of at least a third frequency.

6. The power matching apparatus of claim 5, wherein the receiver circuit comprises serial connected third capacitor and an inductor in parallel with a resistor.

7. The power matching apparatus of claim 5, wherein the at least third frequency is a 162 MHz frequency, a 60 MHz frequency, or a combination thereof.

8. The power matching apparatus of claim 1, wherein the RF power output is coupled to the power junction.

9. The power matching apparatus of claim 8, wherein the RF power output comprises a multi-contact B 20N.

10. The power matching apparatus of claim 8, further comprising a voltage/current detector coupled to the power junction and the RF power output, and an analog board coupled to the voltage/current detector, wherein the analog board is adapted to receive separate voltage and current signals from the voltage/current detector.

11. The power matching apparatus of claim 10, further comprising an interface board coupled to the digital board, and a motor driven board coupled to the interface board, wherein the interface board is adapted to receive and perform a function based on a control signal from the digital board, and the motor driven board is coupled to the first adjustable capacitor and the second adjustable capacitor.

12. The power matching apparatus of claim 11, further comprising a first motor sensor coupled to the first adjustable capacitor and a second motor sensor connected to the second adjustable capacitor.

* * * * *

UNITED STATES PATENT AND TRADEMARK OFFICE
CERTIFICATE OF CORRECTION

PATENT NO. : 7,994,872 B2  
APPLICATION NO. : 12/506658  
DATED : August 9, 2011  
INVENTOR(S) : Shannon et al.

Page 1 of 1

It is certified that error appears in the above-identified patent and that said Letters Patent is hereby corrected as shown below:

In the Claims:

Column 10, Claim 2, Line 16, please delete "the" and insert --a-- therefor.

Signed and Sealed this
Eighth Day of November, 2011

David J. Kappos
*Director of the United States Patent and Trademark Office*